US012689338B2

(12) United States Patent
Farzaneh et al.

(10) Patent No.: US 12,689,338 B2
(45) Date of Patent: Jul. 21, 2026

(54) TRANSIMPEDANCE AMPLIFIERS

(71) Applicant: Semtech Corporation, Camarillo, CA (US)

(72) Inventors: Behzad Farzaneh, London (GB); Matthew George Hagman, Gatineau (CA); Christopher John Born, Bristol (GB)

(73) Assignee: Semtech Corporation, Camarillo, CA (US)

( * ) Notice: Subject to any disclaimer, the term of this patent is extended or adjusted under 35 U.S.C. 154(b) by 516 days.

(21) Appl. No.: 18/303,331

(22) Filed: Apr. 19, 2023

(65) Prior Publication Data

US 2024/0356504 A1     Oct. 24, 2024

(51) Int. Cl.
H03F 3/45         (2006.01)
H03F 1/32         (2006.01)
H04B 10/60        (2013.01)

(52) U.S. Cl.
CPC ............. H03F 3/4508 (2013.01); H03F 1/32 (2013.01); H04B 10/60 (2013.01)

(58) Field of Classification Search
CPC .......... H03F 3/4508; H03F 1/32; H03F 1/083; H03F 1/22; H03F 1/302; H03F 3/08; H03F 2200/447; H04B 10/60

USPC .......................................... 330/308, 252–261
See application file for complete search history.

(56) References Cited

U.S. PATENT DOCUMENTS

2024/0195371 A1*   6/2024   Ferriss ...................... G05F 1/56

* cited by examiner

*Primary Examiner* — Hieu P Nguyen
(74) *Attorney, Agent, or Firm* — Alston & Bird LLP

(57)         ABSTRACT

This application relates to transimpedance amplifiers (TIAs), in particular to TIAs with wideband feedback. The TIA has an input stage, for receiving an input current and outputting a corresponding output voltage, with a first transistor configured as an input transistor in a first circuit branch. A reference controller is configured to provide a reference voltage with a value equal to a DC value of the output voltage and a voltage regulator is configured to receive a supply voltage and generate a regulated voltage with a voltage offset to the reference voltage, such that the voltage offset does not substantially vary with variation in at least one of the supply voltage, temperature and process variations. The regulated voltage is supplied as a supply voltage to the input stage. The TIA also includes control circuitry for controlling an effective transconductance of the first transistor to a defined value.

17 Claims, 3 Drawing Sheets

TRANSIMPEDANCE AMPLIFIERS

TECHNICAL FIELD

The present disclosure is related to apparatus and methods for transimpedance amplifiers, and in particular to frontend stages for transimpedance amplifiers.

BACKGROUND

Transimpedance amplifiers (TIAs) are used in a number of different applications. For example, TIAs are commonly used in optical receivers for optical data communication, where the optical receiver receives a data signal in the form of modulated optical radiation. The optical receiver typically includes a photodiode arranged to convert the received optical signal into a photocurrent and a TIA arranged to convert the photocurrent to a voltage, which may often be a differential voltage, that can be processed by downstream circuitry to recover the encoded data.

For some applications, for instance where the data is encoded using binary symbols, the TIA may be a limiting TIA, which practically means that for large input optical powers, the amplitude of the output voltage at the output of the TIA remains constant. This means that for relatively high-power input signals, the TIA is a non-linear system. For other applications, such as for optical receivers for data transfer using PAM4 modulation or the like, the TIA should remain linear throughout the input dynamic range, i.e. across the whole range of expected input power. In either case, however, the TIA typically has a linear frontend stage to facilitate the photocurrent readout.

The frontend stage of the TIA should preferably convert the single ended photocurrent into a voltage with minimal noise addition, to provide a high signal to noise ratio (SNR) and have a sufficient closed-loop bandwidth in order to prevent inter-symbol interference (ISI). The TIA frontend should also preferably enable a low input impedance, provide a sufficiently high gain so the noise of the following stages become insignificant and be able to handle large input optical modulation amplitude and remain linear.

Shunt-feedback transimpedance amplifiers have been widely used as the frontend stage for TIAs in optical receivers and can be designed to provide at least some the desirable properties discussed above. However, the properties of components of the actual circuitry can differ from the design due to variations in the manufacturing process, and/or variations in operating conditions such as temperature or supply voltage. This can negatively impact the consistency of the shunt-feedback performance.

Embodiments of the present disclosure relate to methods and apparatus for transimpedance amplifiers, in particular to frontend stages for TIAs, that at least mitigate some of the problems with process variations and/or variations in operating conditions.

SUMMARY

According to some embodiments there is provided a transimpedance amplifier circuit comprising: an input stage for receiving an input current and outputting a corresponding output voltage, the input stage comprising a first transistor configured as an input transistor in a first circuit branch; a reference controller configured to provide a reference voltage with a value equal to a DC value of the output voltage; a voltage regulator configured to receive a supply voltage and generate a regulated voltage with a voltage offset to the reference voltage, wherein the voltage offset does not substantially vary with variation in at least one of the supply voltage, temperature and process variations; wherein the regulated voltage is supplied as a supply voltage to the input stage; and control circuitry for controlling an effective transconductance of the first transistor to a defined value.

In some examples, the reference controller may be configured to control an input current to a dummy input stage to generate the voltage reference at an output of the dummy input stage, wherein the dummy input stage is a replica of the input stage. The reference controller may be configured to receive the output voltage and the reference voltage and may comprises a control loop configured to control the input current to the dummy input stage so as the reference voltage is equal to the output voltage at frequencies below a defined cut-off.

In some examples, the voltage regulator may be configured to generate the voltage offset by passing a first defined current through a reference resistor, where the first defined current corresponds to a current from applying a bandgap voltage to a first resistance having the same properties as the reference resistor. The circuit may comprise a bandgap current source for applying the bandgap voltage to the first resistance to generate a current source current and a current mirror configured to mirror the current source current to provide said first defined current. The reference resistor may be connected between first and second nodes, wherein the second node is, in use, at a voltage equal to the reference voltage. The voltage regulator may comprise a control loop configured to control an output of the voltage regulator to be equal to a voltage at the first node to provide the regulated voltage.

In some examples, the control circuitry may comprise a supplemental current generator configured to inject a supplemental current into the first circuit branch. The supplemental current generator may be configured such that supplemental current has a variation with temperature that compensates for temperature variation of the first transistor so that the defined value of transconductance of the first transistor does not substantial vary with at least one of process, supply voltage and temperature variations. The supplemental current generator may comprise a first current source configured to generate a current proportional to absolute temperature, a current mirror for mirroring the current proportional to absolute temperature to provide an output current, and a bandgap current source for subtracting part of the output current to provide the supplemental current. The first current source may comprise a bipolar transistor driven by a bandgap voltage in series with a resistor. In some examples, a current mirror ratio of the current mirror may controllably variable. The current mirror may comprise a plurality of output paths for contributing to the output current and at least one of the output paths can be selectively enabled or disabled. In some examples, the supplemental current generator may be configured so that a scaling factor applied to the supplemental current is controllably variable.

In some examples the circuit may be configured such that a damping factor of the input stage has a value equal to $\sqrt{2}/2$ that does not substantial vary with at least one of process, supply voltage and temperature variations.

In some examples, the input stage may comprise a shunt-feedback transimpedance amplifier. The circuit may, in some implementations, further comprising a differential stage for receiving the output voltage from the input stage and the reference voltage.

Aspects also relates to an optical receiver comprising the transimpedance amplifier circuit of any of the embodiments described herein.

In a further aspect there is provided a transimpedance amplifier circuit comprising: an input stage for receiving an input current and outputting a corresponding output voltage, the input stage comprising a first transistor configured as an input transistor in a first circuit branch; and control circuitry for controlling a DC current of the first transistor so that a damping factor of the input stage is substantially immune to process, supply voltage and temperature variations.

BRIEF DESCRIPTION OF THE DRAWINGS

To better explain various embodiments and examples of the present disclosure and the principles, example implementation and operation thereof, reference will now be made, by way of example, to the following drawings, in which.

DETAILED DESCRIPTION

Embodiments of the present disclosure relate to transimpedance amplifiers (TIAs) and, in particular, to frontend stages of a TIA that could be suitable for use in optical receivers.

Figure 1:
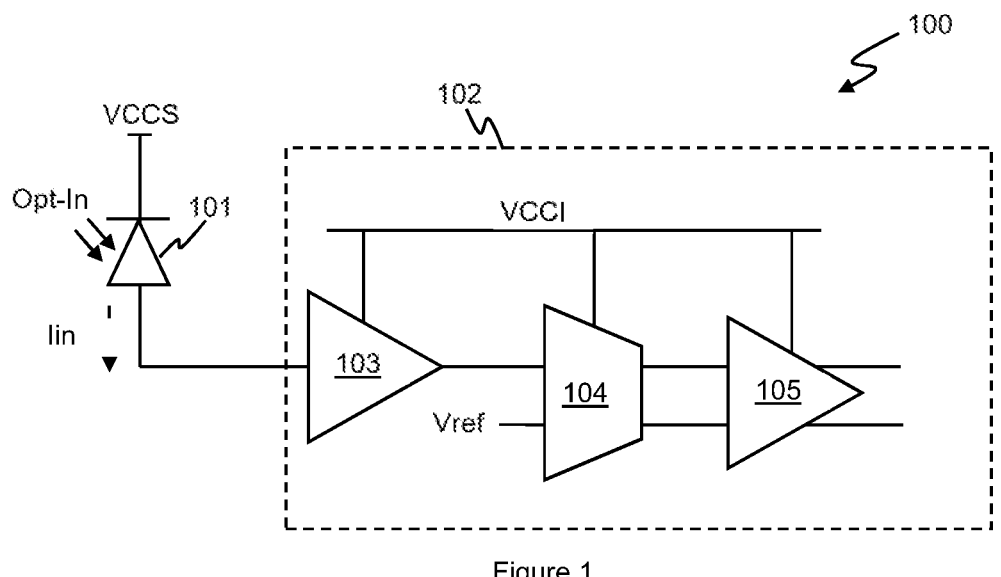
FIG. 1 illustrates generally one example of an optical receiver having a TIA.

FIG. 1 illustrates one example of at least part of a conventional optical receiver 100. FIG. 1 illustrates that the optical receiver 100 has a photodiode, which in this example is reverse biased, and which is configured to receive an optical data signal Opt-In, from a suitable optical data path (not shown) which may be implemented, at least partly, by a fibre optic cable. The photodiode 101 converts the optical signal Opt-In to a corresponding photocurrent Iin which is supplied to a TIA 102.

In the example of FIG. 1, the TIA 102 has a frontend amplifier stage 103 which receives the input photocurrent and generate a corresponding voltage which is applied to a differential stage 104. The differential stage 104 also receives a voltage reference Vref and generates a differential output which, in this example, is amplified by a differential output stage 105 to provide a differential output voltage.

Figure 2:
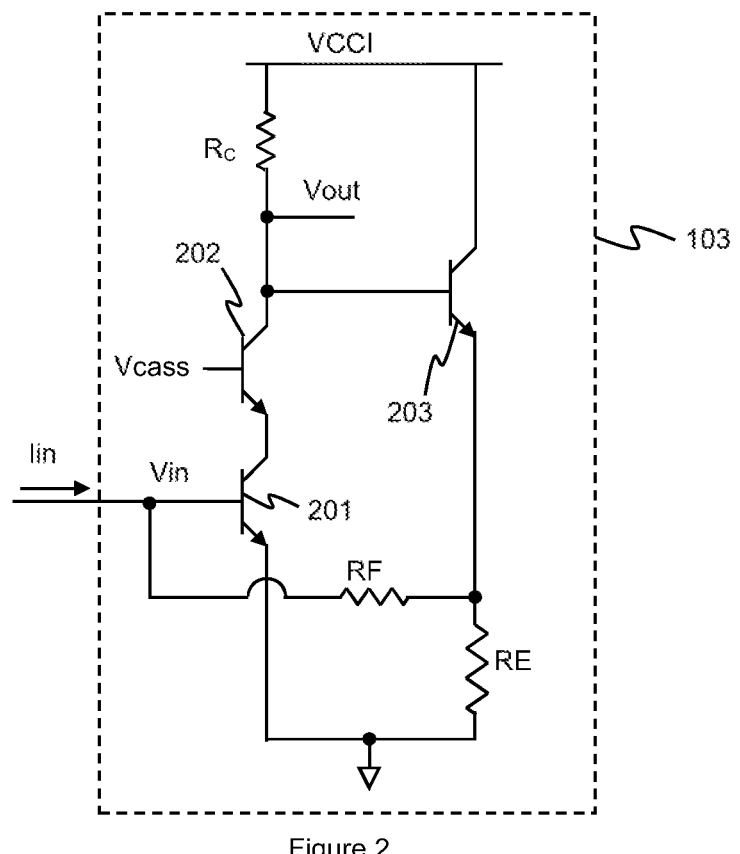
FIG. 2 illustrates a conventional TIA frontend stage.

FIG. 2 illustrates one example of a typical frontend stage 103 of a TIA, implemented as a bipolar shunt-feedback transimpedance amplifier. A first transistor 201 is arranged as an input transistor with its base terminal connected to the TIA input receiving the input photocurrent Iin. The first transistor 201 is arranged in series with a resistance $R_C$ in a first circuit branch and, in the example of FIG. 2, there is also a second transistor 202 in the first circuit branch in a cascode arrangement, driven by a bias voltage Vcass. In the example of FIG. 2, a third transistor 203 is arranged in a second circuit branch with a resistance RE, where the third transistor 203 is driven by the voltage between the resistance $R_C$ and second transistor 202. Feedback from the second circuit branch is provided to the TIA input via a feedback resistance RF. In the example of FIG. 2 the output voltage from the frontend stage is taken from the first circuit branch, between the resistance $R_C$ and the cascode transistor 202, but it will be understood that other arrangements are possible.

As discussed above, the TIA frontend stage 103 should preferably be low noise and able to cope with relatively low levels of input current with good SNR, but also be able to handle relatively large input optical modulation amplitude and remain linear.

In addition, the closed-loop bandwidth of the TIA frontend directly determines the extent of the inter-symbol interference (ISI), and the closed loop bandwidth should also be high enough in order to prevent significant inter-symbol interference (ISI).

As will be understood by one skilled in the art, the transfer function A(jw) of such a frontend amplifier can (taking only the dominant pole into account) be given by:

$$A(j\omega) = \frac{R_C \times g_{m201}}{(1 + j(\omega R_C C_L))} \qquad \text{Eqn. (1)}$$

where $R_C$ is the resistance value of resistor $R_C$, $C_L$ is the sum of both the base-collector capacitances $C\mu$ of the transistors 202 and 203 together with the input capacitance of the amplifier that follows the frontend and any relevant parasitic capacitance at the base of 203, and $g_{m201}$ is the transconductance of the input transistor 201. The transconductance $g_m$ can be given by:

$$g_m = \frac{I_C}{V_t} = \frac{I_C q}{kT} \qquad \text{Eqn. (2)}$$

where $I_C$ is the quiescent or DC collector current, $V_T$ is the thermal voltage, q is the magnitude of electrical charge of an electron, k is the Boltzmann constant and T is temperature in Kelvin.

As will also be understood be one skilled in the art, the loop of the TIA frontend will have a damping factor or damping ratio. For the frontend amplifier of FIG. 2, the damping factor $\zeta$ can be given as:

$$\zeta = \frac{1}{2} \frac{R_f C_T \omega_A + 1}{\sqrt{(A_0 + 1)\omega_A R_f C_T}} \qquad \text{Eqn. (3)}$$

where $R_f$ is the resistance of the feedback resistor RF and $C_T$ is the total capacitance at the input of the TIA, i.e. the sum of the base-emitter capacitance $C_{TT}$ of the transistor 201 with the photodiode output capacitance and parasitic capacitance at the base of transistor 201. $\omega_A$ is angular frequency of the pole of the loop, which is given by $\omega_A = 1/C_L R_C$ and $A_0$ is the DC gain given by $A_0 = g_m R_C$.

Assuming that $R_f C_{T\omega A} \gg 1$ and $A_0 \gg 1$, the damping factor can be simplified to:

$$\zeta = \frac{1}{2} \sqrt{\frac{\frac{R_f C_T}{R_C C_L}}{g_{m201} R_C}} \qquad \text{Eqn (4)}$$

The ideal value for the damping factor $\zeta$ is generally equal to $\sqrt{2}/2$, and therefore it may be advantageous to design the TIA frontend with a value of damping factor $\zeta$ that is substantially equal to $\sqrt{2}/2$. This can allow optimal settling time without problems of peaking of the transfer function and "ringing" in the time response.

The TIA frontend may therefore be designed to provide a desired value of damping factor $\zeta$. However, process variations, which result in components of the circuitry having properties that differ from the design values, may lead to a departure from the desired damping factor.

The feedback resistance RF and resistance RC can be designed and laid out so that any variations due to process and/or operating conditions may be expected to affect the unit resistance of each resistor in the same way, and thus the $R_f/R_C$ term of equation 4 may remain substantially constant with such variations. However, the $g_{m201}R_C$ term can vary significantly with process variations and/or from variations in operating conditions such as supply voltage or temperature. For instance, it will be clear from equation 2 that the transconductance $g_m$ has a dependence on temperature and also on the DC current $I_C$, which in turn depends on the supply voltage. Thus, variations in the temperature or the supply voltage VCCI can lead to variations in the value of $g_m$ and hence a variation in the damping factor $\zeta$. Likewise process variations can result in the value of the $g_{m201}$ term departing from the design value.

Variations in the value of $g_m$ can result in the damping factor moving from the design value, e.g. the ideal value of $\sqrt{2}/2$. For instance, the damping factor may move towards 1 at higher temperatures and towards 0 at low temperatures. This can result in the frontend being over-damped and suffering from a lack of bandwidth at higher temperatures, which can lead to an increased bit error rate due to ISI. At lower temperatures, however, the reduced damping can lead to undesirable transfer function peaking, which can exacerbate other non-idealities of the optical link, such as peaking caused by optical dispersion in the optical link.

Embodiments of the present disclosure relate to TIAs and in particular to frontend circuitry for TIAs that at least mitigate at least of the issues of process variations and/or variation in operating conditions, e.g. for one or more process, voltage or temperature (PVT) variations.

Figure 3:
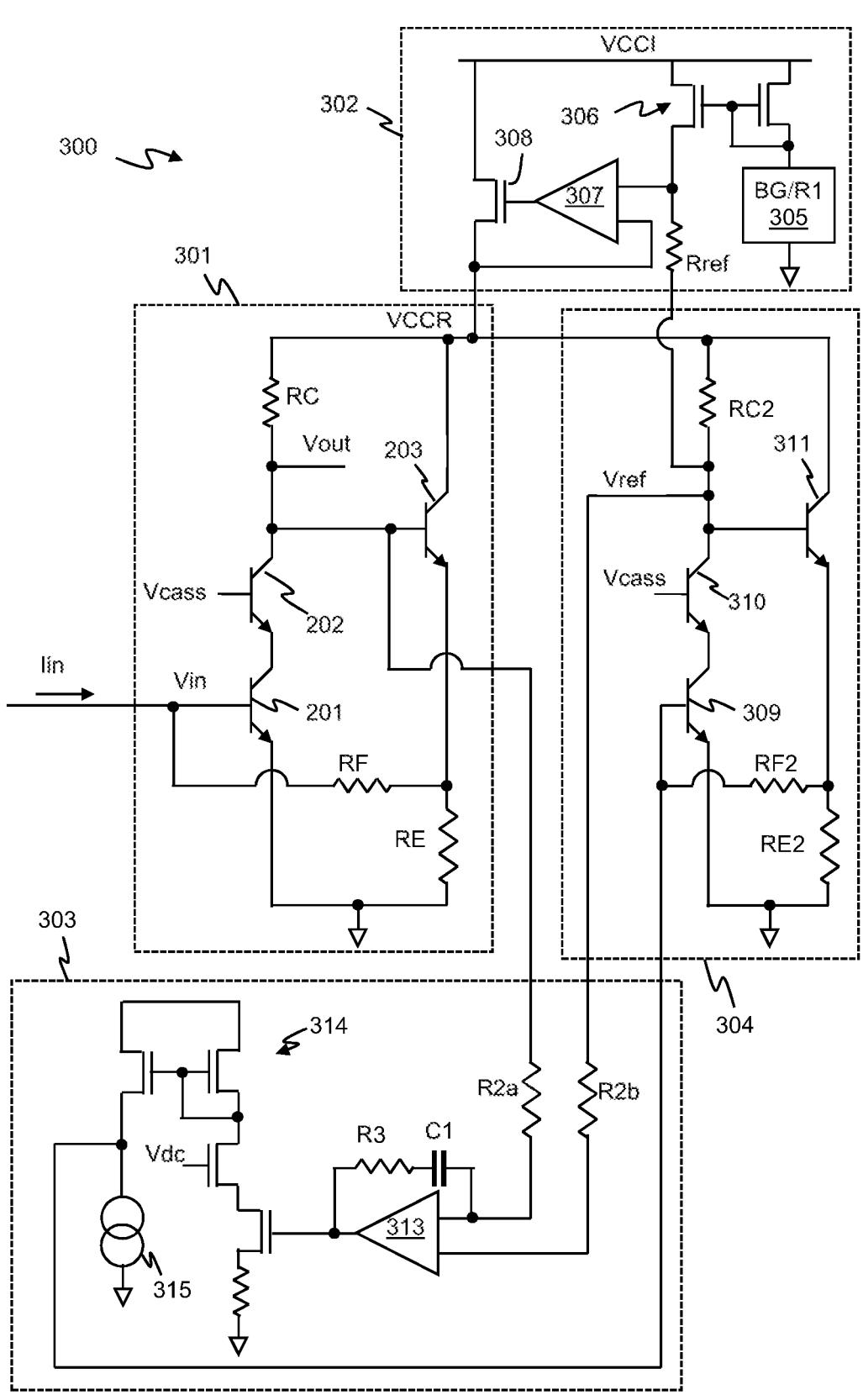
FIG. 3 illustrates a TIA frontend stage according to an embodiment.

FIG. 3 illustrates one example of TIA circuitry 300, which may be suitable for use of as a TIA frontend of an optical receiver, in which similar components to those discussed previously are identified by the same reference numerals.

The frontend circuitry 300 comprises an input stage 301 which is similar to that described with respect to FIG. 2, with input transistor 201 and cascode transistor 202 in a first circuit branch with resistance RC and a third transistor 203 in a second circuit branch with resistor RE providing feedback to the input via feedback resistor RF. The frontend circuitry 300 also comprises a voltage regulator 302 that generates a regulated voltage for the input stage 301. The example of FIG. 3 also includes a reference controller 303 that, together with a dummy input stage 304, generates the reference voltage Vref for the downstream differential stage.

The voltage regulator 302 operates to provide a regulated voltage VCCR which is substantially immune to variations in the supply voltage VCCI and which is also stable with temperature. In the example of FIG. 3, the voltage regulator 302 comprise a bandgap current generator 305 which generates a current $V_{BG}/R1$ by applying a bandgap voltage $V_{BG}$ across a resistance R1. This defined current is mirrored by current mirror arrangement 306 to provide a corresponding current in a circuit branch that includes a resistance Rref connected to a node at the reference voltage Vref. Op-amp 307 receives a voltage from a node of the circuit branch upstream of the resistance Rref and controls an output device 308 so that output voltage VCCR of the voltage regulator 302 is equal to this input voltage to the op-amp 307. This means that the output of the voltage regulator 302 is controlled to be equal to:

$$VCCR = V_{ref} + \frac{V_{BG}}{R1} * R_{ref} \qquad \text{Eqn. (5)}$$

If Rref is designed with the same unit resistance as the resistor R1 used in the bandgap current generator, equation 5 can be rewritten as:

$$VCCR = V_{ref} + \alpha \times V_{BG} \qquad \text{Eqn. (6)}$$

where $\alpha$ is a constant, $\alpha=Rref/R1$, that is a constant that, to the first order, does not vary with process variations or with temperature. The regulated voltage VCCR is thus equal to the value of Vref plus a substantially constant voltage, i.e. the regulated voltage is generated as having a stable DC offset from the reference voltage Vref, i.e. an offset which is substantially immune to variations in the supply voltage VCCI and/or to temperature or process variations.

It will be understood that FIG. 3 illustrates one particular example of a suitable voltage generator for generating such a regulated voltage, but there would be other ways to generate such a regulated voltage.

As discussed above, the reference generator 303, together with the dummy input stage 304, generate the reference voltage Vref. The control loop of the reference controller 303 controls the dummy input stage 304 so as to generate a reference voltage Vref so that for low frequencies, below a defined cut-off, the value of Vref is approximately equal to Vout. In other words, the reference voltage Vref is generated such that Vref is approximately equal to the DC value of the output voltage Vout.

The dummy input stage 304 is a replica of the input stage 301, in that in comprises similar components in a similar arrangement to those of the input stage 301. The dummy input stage thus comprises transistors 309, 310 and 311 which correspond to transistors 201, 202 and 203 respectively of the input stage 301, along with resistances RC2, RE2 and RF2 that correspond to the resistances RC, RE and RF respectively of the input stage 301. The input for the dummy input stage 304 is provided by the reference generator 303 and the output from the dummy input stage provides the voltage reference Vref.

The reference controller 303 receives, via matched resistances R2a and R2b, the output voltage Vout and the reference voltage Vref. Op-amp 313, with capacitance C1 and resistance R3, effectively provides a low-pass filtering or averaging function that controls current mirror arrangement 314 connected to current source 315, to control the input current to the dummy input stage 304 such that the output, i.e. Vref, is equal to the DC or average value of Vout. Again it will be understood that the particular reference controller 303 and dummy input stage 304 of FIG. 3 are examples of one convenient way in which to generate the reference voltage but alternative arrangements would be used.

As the DC value of the output voltage Vout is effectively equal to the reference voltage Vref, this means that the DC current though the resistance RC of the input stage 301 is equal to $(VCCR-Vref)/R_C$. As noted above the voltage regulator 302 operates to regulate the voltage VCCR to a value which has a controlled and stable offset to Vref. The DC value of the current $I_{RC}$ through the resistance RC is thus equal to:

$$I_{RC} = \left[ \frac{(V_{ref} + \alpha \times V_{BG}) - V_{ref}}{R_C} \right] = \frac{(\alpha \times V_{BG})}{R_C} \qquad \text{Eqn. (7)}$$

Assuming that the transistor gains β of transistors 202 and 203 are much greater than 1, the quiescent or DC current $I_C$ of transistor 201 can be formulated as:

$$I_C = I_{RC} = \frac{\alpha \times V_{BG}}{R_C} \qquad \text{Eqn. (8)}$$

Equation 4, giving the damping factor ζ, can thus be rewritten as:

$$\zeta = \frac{1}{2} \sqrt{ \frac{\dfrac{R_f C_T}{R_C C_L}}{\dfrac{q}{kT} \times \alpha \times V_{BG}} } \qquad \text{Eqn. (9)}$$

As discussed above, the feedback resistance RF and resistance RC of the input stage 301 can be designed and laid out so that any variations due to process and/or operating conditions may be expected to affect the unit resistance of each resistor in the same way, and thus the $R_f/R_C$ term of equation 9 may remain substantially constant with such variations. As discussed above, $\alpha \times V_{BG}$ is also a constant that is substantially independent of process and supply voltage variations and the (q/kT) term is also not affected by process variations or any variation in supply voltage.

The damping factor ζ of the embodiment of FIG. 3 is thus, at least to a first order, substantially immune to process variations and also does not vary with variations in supply voltage, which can offer improved performance compared with the conventional TIA frontend circuitry.

Figure 4:
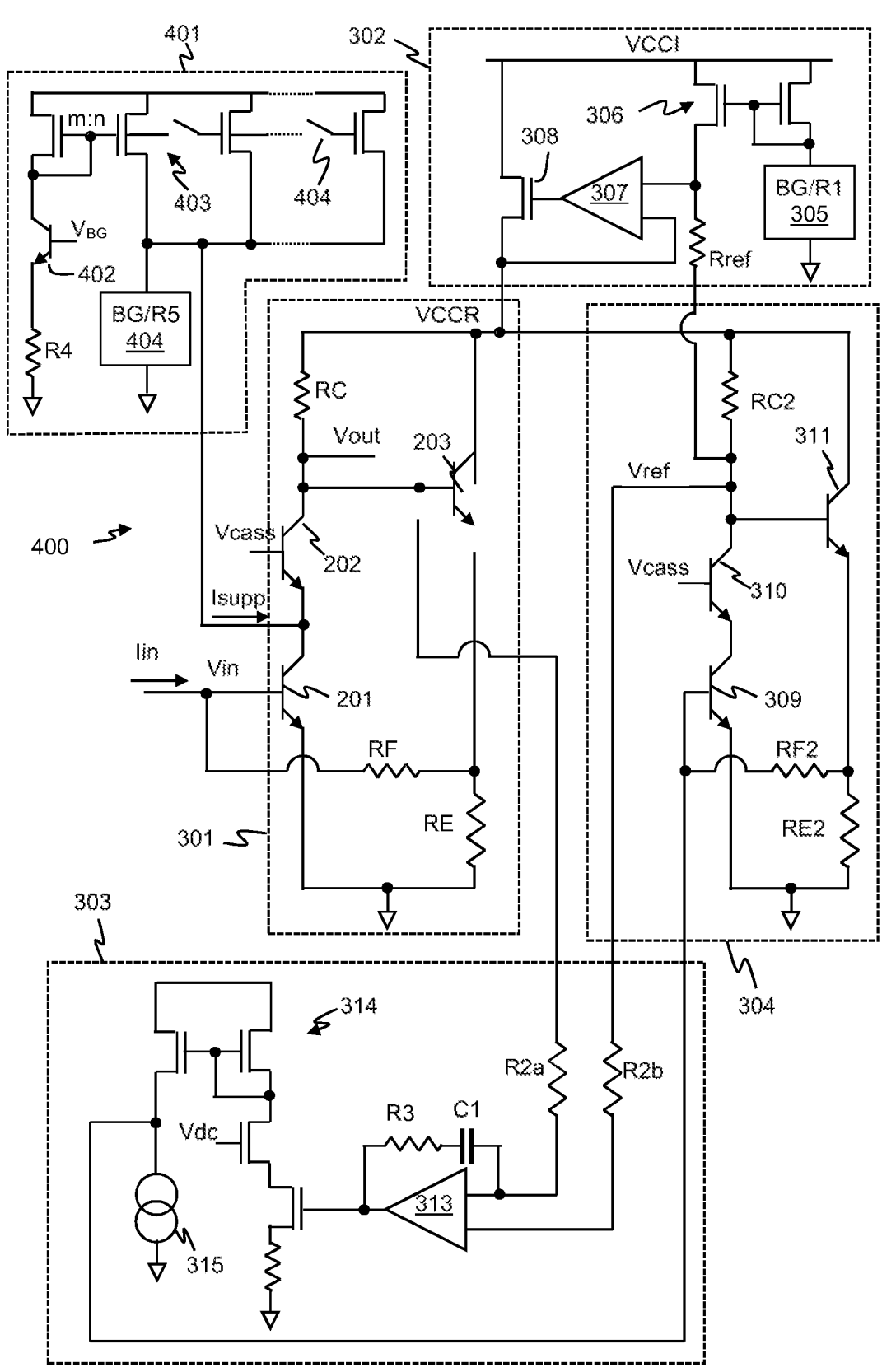
FIG. 4 illustrates a TIA frontend stage according to another embodiment.

It will be understood, however, that the damping factor ζ of equation 9 does include a q/kT term and thus does exhibit a variation with temperature. FIG. 4 illustrates another embodiment of TIA circuitry, which also mitigates for temperature variations. FIG. 4 illustrates TIA circuitry 400, which may be suitable for use of as a TIA frontend of an optical receiver, in which similar components to those discussed previously are identified by the same reference numerals.

The frontend circuitry 400 comprises an input stage 301, voltage regulator 302, reference controller 303 and dummy input stage 304 as described with reference to FIG. 3. In addition, the frontend circuitry 400 comprises a supplemental current generator 401 for generating a supplemental or boost current that is injected into the first circuit branch of the input stage 301. In the example of FIG. 4, the supplemental current is injected into the first current branch between the cascode transistor 202 and input transistor 201 so as to add to the collector current of input transistor 201. The supplemental current is generated so as reduce the effect of temperature on the damping factor ζ. In effect the supplemental current has a temperature dependence such that any temperature dependent variation in the transconductance $g_m$ of the input transistor 201 is compensated by a variation in the supplemental current.

The supplemental current generator 401 in the example of FIG. 4 comprises a transistor 402 driven by a bandgap voltage $V_{BG}$, e.g. a bipolar transistor driven by a bandgap voltage $V_{BG}$ to generate a current proportional to absolute temperature IPTAT through a resistance R4. This current is mirrored by current mirror arrangement 403. Bandgap current generator 404 operates to subtract a current equal to $V_{BG}/R5$ from the total mirrored current, and the remaining current is injected into the first circuit branch of the input stage 301 as the supplemental current Isupp.

The supplemental current Isupp is thus equal to:

$$Isupp = n/m \times I_{PTAT} - V_{BG}/R_5 = n/m \times \frac{c_{BG} \times \dfrac{kT}{q}}{R_4} - V_{BG}/R_5 \qquad \text{Eqn. (10)}$$

where n/m is the current mirror ratio. $C_{BG}$ is the bandgap constant which, to the first order, is immune to process and temperature variations.

In the embodiment of FIG. 4, the DC collector current $I_C$ of transistor 201 is equal to $I_{RC}$+Isupp, and thus:

$$I_C = \alpha \times V_{BG}/R_C + n/m \times \frac{c_{BG} \times \dfrac{kT}{q}}{R_4} - V_{BG}/R_5 \qquad \text{Eqn. (11)}$$

$$= (\alpha \times V_{BG}/R_C - V_{BG}/R_5) + n/m \times \frac{c_{BG} \times \dfrac{kT}{q}}{R_4}$$

If the values of α(=Rref/R1), $R_C$ and $R_5$ are arranged such that $\alpha/R_C=1/R_5$, then the first term of equation 11 will cancel. In this case:

$$I_C \approx n/m \times \frac{c_{BG} \times \dfrac{kT}{q}}{R_4} \qquad \text{Eqn. (12)}$$

This results in the transconductance $g_{m201}$ of the input transistor being given by:

$$g_{m201} = \frac{I_C q}{kT} = \frac{n \times c_{BG}}{m \times R_4} \qquad \text{Eqn. (13)}$$

The transconductance $g_m$ can thus be seen as being independent of temperature. Applying this to equation 4, the damping factor ζ is given by:

$$\zeta = \frac{1}{2} \sqrt{ \frac{\dfrac{R_f C_T}{R_C C_L}}{g_{m201} R_C} } = \frac{1}{2} \sqrt{ \frac{\dfrac{R_f C_T}{R_C C_L}}{\dfrac{n C_{BG} R_C}{m R_4}} } \qquad \text{eqn. (14)}$$

In this case, if the feedback resistance RF and resistance RC of the input stage 301 and also the resistance R4 are designed and laid out so that any variations due to process and/or operating conditions may be expected to affect the unit resistance of each resistor in the same way, and the $R_f/R_C$ term and also the $R_C/R_4$ term of equation 14 may remain substantially constant with such variations.

The damping factor $\zeta$ is thus substantially immune to any process variations and also will remain substantially constant with variation in temperature and/or supply voltage. This means that the TIA frontend will be expected to have the design value for the damping factor, e.g. the critical damping factor value of $\sqrt{2}/2$ from part-to-part, without varying due to process variations, and the value of damping factor will not vary substantially with supply voltage variations or temperature (at least within the normal expected operating range), thus avoiding the issues of a bit error rate that varies with temperature or undesirable transfer function peaking.

The current mirror arrangement 403 of the supplemental current generator 401 could be arranged to have a fixed ratio min, e.g. by appropriate choice of channel widths of the relevant transistors. However, it may be advantageous in some embodiments to allow the current mirror ratio min to be set to a desired value after fabrication. This can allow for a calibration of the effective transconductance $g_m$ of the input transistor 201.

Thus, as illustrated in FIG. 4, the current mirror arrangement 403 comprises a plurality of different current mirror branches for passing a mirrored current, where the different current mirror branches can be selectively enabled by switches 404 to contribute current to the output of the as illustrated in FIG. 4. The plurality of current mirror branches can thus be seen as a plurality of different output paths for the current mirror arrangement 403. After manufacture a desired number of output paths of the current mirror arrangement 403 can be selectively enabled to provide a desired current mirror ratio. In some cases each of the different output paths could, when enabled, contribute equal currents, or at least some of the output paths may contribute differently scaled currents. By appropriate selection of the output current paths which are enabled, the overall current mirror ratio min may be controllably varied between a plurality of different ratio values/within a defined range.

As will be understood by one skilled in the art, equation 2 above shows the ideal definition of the transconductance $g_m$ of a bipolar transistor. However, in practice, the effective transconductance $g_m$ eff can vary according the emitter resistance $r_e$, such that $g_{m\_eff} = g_m/(1 + g_m r_e)$. If the emitter resistance $r_e$ is close to zero, then the effective transconductance will be approximately equal to the ideal value $g_m$. If, however, the emitter resistance $r_e$ is significant, the effective transconductance $g_m$ eff can fall below the ideal value, which can negatively impact parameters such as bandwidth and input referred noise.

In embodiments of the present disclosure, the ability to set the current mirror ratio min to different values after manufacture can effectively allow the value of $g_m$ to be set after manufacture. The value of $g_m$ could, for instance, be set based on an indication of the actual value of the emitter resistance $r_e$ so as to allow calibration of the effective value of $g_{m\_eff}$ to be close to a desired value.

For instance, the closed loop bandwidth of the of the input stage of FIG. 4 may be estimated by the corner frequency $f_{-3}$ $dB$ as:

$$f_{-3dB} = \frac{1}{2\pi}\frac{\sqrt{2}\,A_0}{R_F C_T} = \frac{1}{2\pi}\frac{\sqrt{2}\,g_{m201}R_C}{R_F C_T} \qquad \text{Eqn. (15)}$$

As discussed above, the term $g_{m201} \times R_C$ for the embodiment of FIG. 4 is substantially immune to PVT variations.

However the absolute value of $f_{-3\,dB}$ can vary from part-to-part due to variations in the value RF of the feedback resistance RF.

In some cases, any variation in $f_{-3db}$ may be tolerated. The embodiment of FIG. 4 ensures that the damping factor $\zeta$ has a desired value, such as the critical damping value of $\sqrt{2}/2$, which does not vary and this leads to an optimal time response. A bandwidth which may thus vary from a design value may thus be acceptable for some applications.

In the embodiment of FIG. 4 however, the current mirror has a current mirror ratio min which can be varied after manufacture. From equation 13 it will be clear that the transconductance $g_m$ of input transistor 201 varies with the current mirror ratio min. In some cases, the value of the current mirror ratio min may be set after manufacture based on an indication of the actual value of the feedback resistance RF so that the value of $f_{-3\,dB}$ is close to the design value.

It will, of course, be understood, that the desired damping factor I will be achieved with a particular value of the current mirror ratio min, and that any variation from this design value to calibrate the bandwidth can result in a variation of the damping factor. However it may be beneficial in some applications to have a damping factor $\zeta$ that varies from the ideal value to provide a bandwidth closer to desired value. In some cases the current mirror ratio min could be set to provide the desired value for $f_{-3\,dB}$ and then the value of the load capacitance controllably varied, e.g. calibrated, based on the value of $g_m$ that results from the chosen current mirror ration min so as to ensure that the damping factor $\zeta$ also has the desired design value. This could be achieved, for example, by a controllable capacitor bank (not illustrated in FIG. 4).

In general, therefore, embodiments of the disclosure provide TIA circuitry suitable for use as a frontend of a TIA in applications such as an optical receiver in which the damping factor $\zeta$ does nor substantially vary with at least one of temperature, supply voltage and process variations.

In the examples of FIGS. 3 and 4 the TIA circuitry comprises an input stage 301 for receiving an input current and generating an output voltage. The input stage has an input transistor in a first circuit branch. A reference controller 303 controls a reference voltage which is substantially equal to the DC value of the voltage output. In the examples of FIGS. 3 and 4, the reference generator 303 controls a dummy input stage 304, which is a replica of the input stage 301, to generate the reference voltage. A voltage regulator 302 generates a regulated supply voltage with a stable voltage offset to the reference voltage, i.e. the voltage offset is substantially immune to at least one of process, supply voltage and temperature variations. The regulated voltage is used as a supply voltage for the input stage. In the example of FIG. 4 a supplemental current generator generates a supplemental current which is injected into the first current branch to at least partly define the DC current for the first transistor. The supplemental current has a temperature variation that compensates for temperature variation of the first transistor so that the first transistor has a stable value transconductance with at least one of process, supply voltage and temperature variations. In some examples a scaling factor applied to the supplemental current may be controllably variable, e.g. by controlling a current mirror ratio, so as to allow for calibration of the transconductance of the first transistor.

The TIA circuitry may be used as a frontend stage of a TIA apparatus which may be a limiting TIA or a linear TIA. The TIA apparatus may comprise at least one downstream stage which may, for example by a differential stage. The differential stage may receive the output voltage and the reference voltage.

The TIA circuitry may form part of an optical receiver although embodiments may alternatively be used in other applications.

It will be understood that the examples and embodiments described above are given by way of example only and those skilled in the art will understand that modifications, variations, additions or alterations may be made to specific embodiments described, or alternative embodiments may be implemented, without departing from the scope of the appended claims.

It should be noted that as used herein, unless expressly stated otherwise, the word "comprising" does not exclude the presence of other elements or steps other than those listed, references to an element or feature in the singular does not exclude the possibility of a plurality of such elements or features, and that recitation of different features or elements in the appended claims does not necessarily imply separate components; a single component or unit may fulfil the function of several elements recited in a claim. Any reference signs in the appended claims shall not be construed so as to limit their scope.

The invention claimed is:

1. A transimpedance amplifier circuit comprising:
a single-ended input stage for receiving an input current and outputting a corresponding output voltage, the input stage comprising a first transistor configured as an input transistor in a first circuit branch;
a reference controller configured to provide a reference voltage with a value equal to a DC value of the output voltage;
a voltage regulator configured to receive a supply voltage and generate a regulated voltage with a voltage offset to the reference voltage, wherein the voltage offset does not substantially vary with variation in at least one of the supply voltage, temperature and process variations, wherein the regulated voltage is supplied as a supply voltage to the input stage so as to generate a DC current component in the first circuit branch; and
control circuitry for controlling a supplemental current in the first circuit branch to control an effective transconductance of the first transistor to a defined value.

2. The transimpedance amplifier circuit of claim 1 wherein said control circuitry comprise a supplemental current generator configured to inject the supplemental current into the first circuit branch.

3. The transimpedance amplifier circuit of claim 2, wherein the supplemental current generator is configured such that supplemental current has a variation with temperature that compensates for temperature variation of the first transistor so that the defined value of transconductance of the first transistor does not substantial vary with at least one of process, supply voltage and temperature variations.

4. The transimpedance amplifier circuit of claim 2 wherein the supplemental current generator is configured so that a scaling factor applied to the supplemental current is controllably variable.

5. The transimpedance amplifier circuit of claim 1 wherein a damping factor of the input stage has a value equal to $\sqrt{2}/2$ that does not substantial vary with at least one of process, supply voltage and temperature variations.

6. The transimpedance amplifier circuit of claim 1 wherein the input stage comprises a shunt-feedback transimpedance amplifier.

7. The transimpedance amplifier circuit of claim 1 further comprising a differential stage for receiving the output voltage from the input stage and the reference voltage.

8. An optical receiver comprising the transimpedance amplifier circuit of claim 1.

9. A transimpedance amplifier circuit comprising:
an input stage for receiving an input current and outputting a corresponding output voltage, the input stage comprising a first transistor configured as an input transistor in a first circuit branch;
a reference controller configured to provide a reference voltage with a value equal to a DC value of the output voltage, wherein the reference controller is configured to control an input current to a dummy input stage to generate the voltage reference at an output of the dummy input stage, wherein the dummy input stage is a replica of the input stage; and
a voltage regulator configured to receive a supply voltage and generate a regulated voltage with a voltage offset to the reference voltage, wherein the voltage offset does not substantially vary with variation in at least one of the supply voltage, temperature and process variations, wherein the regulated voltage is supplied as a supply voltage to the input stage; and
control circuitry for controlling an effective transconductance of the first transistor to a defined value.

10. The transimpedance amplifier circuit of claim 9 wherein the reference controller is configured to receive the output voltage and the reference voltage and comprises a control loop configured to control the input current to the dummy input stage so as the reference voltage is equal to the output voltage at frequencies below a defined cut-off.

11. A transimpedance amplifier circuit comprising:
an input stage for receiving an input current and outputting a corresponding output voltage, the input stage comprising a first transistor configured as an input transistor in a first circuit branch;
a reference controller configured to provide a reference voltage with a value equal to a DC value of the output voltage;
a voltage regulator configured to receive a supply voltage and generate a regulated voltage with a voltage offset to the reference voltage, wherein the voltage offset does not substantially vary with variation in at least one of the supply voltage, temperature and process variations, wherein the regulated voltage is supplied as a supply voltage to the input stage, wherein the voltage regulator is configured to generate said voltage offset by passing a first defined current through a reference resistor, where the first defined current corresponds to a current from applying a bandgap voltage to a first resistance having the same properties as the reference resistor; and
control circuitry for controlling an effective transconductance of the first transistor to a defined value.

12. The transimpedance amplifier circuit of claim 11 comprising a bandgap current source for applying the bandgap voltage to said first resistance to generate a current source current and a current mirror configured to mirror the current source current to provide said first defined current.

13. The transimpedance amplifier circuit of claim 11 wherein the reference resistor is connected between first and second nodes, wherein the second node is, in use, at a voltage equal to the reference voltage and the voltage regulator comprises a control loop configured to control an output of the voltage regulator to be equal to a voltage at the first node to provide the regulated voltage.

14. A transimpedance amplifier circuit comprising:

an input stage for receiving an input current and outputting a corresponding output voltage, the input stage comprising a first transistor configured as an input transistor in a first circuit branch;

a reference controller configured to provide a reference voltage with a value equal to a DC value of the output voltage;

a voltage regulator configured to receive a supply voltage and generate a regulated voltage with a voltage offset to the reference voltage, wherein the voltage offset does not substantially vary with variation in at least one of the supply voltage, temperature and process variations, wherein the regulated voltage is supplied as a supply voltage to the input stage; and control circuitry for controlling an effective transconductance of the first transistor to a defined value, wherein said control circuitry comprise a supplemental current generator configured to inject a supplemental current into the first circuit branch, wherein the supplemental current generator comprises a first current source configured to generate a current proportional to absolute temperature, a current mirror for mirroring the current proportional to absolute temperature to provide an output current, and a bandgap current source for subtracting part of the output current to provide the supplemental current.

15. The transimpedance amplifier circuit of claim 14, wherein the first current source comprises a bipolar transistor driven by a bandgap voltage in series with a resistor.

16. The transimpedance amplifier circuit of claim 14, wherein a current mirror ratio of the current mirror is controllably variable.

17. The transimpedance amplifier circuit of claim 16 wherein the current mirror comprises a plurality of output paths for contributing to the output current and at least one of the output paths can be selectively enabled or disabled.

* * * * *